United States Patent
Basker et al.

(10) Patent No.: US 9,576,980 B1
(45) Date of Patent: Feb. 21, 2017

(54) FINFET DEVICES HAVING GATE DIELECTRIC STRUCTURES WITH DIFFERENT THICKNESSES ON SAME SEMICONDUCTOR STRUCTURE

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Singerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/830,868

(22) Filed: Aug. 20, 2015

(51) Int. Cl.
H01L 21/00 (2006.01)
H01L 21/84 (2006.01)
H01L 27/12 (2006.01)
H01L 29/66 (2006.01)
H01L 21/28 (2006.01)
H01L 29/51 (2006.01)
H01L 21/8234 (2006.01)

(52) U.S. Cl.
CPC ..... H01L 27/1211 (2013.01); H01L 21/28088 (2013.01); H01L 21/823462 (2013.01); H01L 21/845 (2013.01); H01L 29/511 (2013.01); H01L 29/6656 (2013.01); H01L 29/66545 (2013.01)

(58) Field of Classification Search
CPC ............ H01L 29/66795; H01L 29/785; H01L 29/66545; H01L 21/823431; H01L 21/823821; H01L 21/845; H01L 21/28088; H01L 27/1211; H01L 29/6656; H01L 21/823462; H01L 29/511
USPC .................................. 438/157; 257/310, 392
See application file for complete search history.

(56) References Cited

U.S. PATENT DOCUMENTS

| | | |
|---|---|---|
| 7,183,596 B2 | 2/2007 | Wu et al. |
| 7,846,790 B2 | 12/2010 | Kang et al. |
| 7,892,960 B2 | 2/2011 | Park |
| 7,932,152 B2 | 4/2011 | Wong et al. |
| 8,021,942 B2 | 9/2011 | Wei et al. |
| 8,217,435 B2 | 7/2012 | Chang et al. |
| 8,778,750 B2 | 7/2014 | Cartier et al. |
| 8,859,371 B2 | 10/2014 | Song et al. |
| 8,877,625 B1 | 11/2014 | Lian |
| 2012/0032732 A1 | 2/2012 | Xiao et al. |
| 2013/0270620 A1* | 10/2013 | Hu ................... H01L 21/76229 257/296 |
| 2014/0349452 A1 | 11/2014 | Wang et al. |

* cited by examiner

Primary Examiner — Thien F Tran
(74) Attorney, Agent, or Firm — Vazken Alexanian; Ryan, Mason & Lewis, LLP

(57) ABSTRACT

FinFET devices are formed on the same semiconductor structure wherein at least one finFET device has a gate dielectric structure that is different in thickness relative to a gate dielectric structure of at least one other finFET device. The finFET devices are formed as part of the same fabrication process.

20 Claims, 8 Drawing Sheets

100

200

FINFET DEVICES HAVING GATE DIELECTRIC STRUCTURES WITH DIFFERENT THICKNESSES ON SAME SEMICONDUCTOR STRUCTURE

BACKGROUND

Complementary metal-oxide semiconductor (CMOS) devices typically employ at least one gate which is separated from a conducting channel (or channels) of the device by a gate dielectric material. Examples of such CMOS devices that employ a gate dielectric material include, but are not limited to, field effect transistors (FETs). By way of example, FETs have been used in application specific integrated circuit (ASIC) devices, microprocessor devices, etc. A specific type of FET, known as a finFET, has become a choice for 22 nanometer (nm) technologies and beyond. The finFET device is characterized by the conducting channel being formed by a raised silicon fin structure, which is separated from a surrounding gate by a gate dielectric material. System-on-a-chip (SOC) designs typically employ high speed finFET devices for applications including, but not limited to, input/output (I/O) devices, analog functions, embedded dynamic random access memory (DRAM), etc.

SUMMARY

Embodiments provide techniques for fabricating finFET devices on the same semiconductor structure wherein at least one finFET device has a gate dielectric structure that is different in thickness relative to a gate dielectric structure of at least another finFET.

For example, in one embodiment, a method comprises forming a first finFET device on a substrate structure wherein the first finFET device comprises a gate dielectric structure having a first thickness, and forming a second finFET device on the substrate structure wherein the second finFET device comprises a gate dielectric structure having a second thickness. The first thickness and the second thickness are different, and the first finFET device forming step and the second finFET device forming step are part of the same fabrication process.

DETAILED DESCRIPTION

Figure 1:
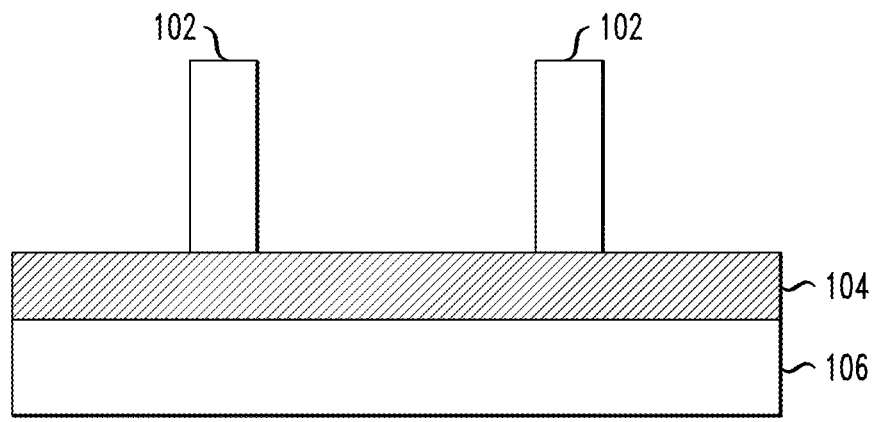
FIG. 1 is a schematic cross-sectional side view of a semiconductor structure at an initial stage of fabrication starting with a substrate structure having multiple fin structures formed thereon, according to an embodiment of the invention.

Embodiments will now be described in further detail with regard to techniques for forming finFETs with gate dielectric structures of different thicknesses on the same semiconductor structure. It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. Also, in the figures, the illustrated scale of one layer, structure, and/or region relative to another layer, structure, and/or region is not necessarily intended to represent actual scale.

Methods for fabricating finFETs with gate dielectric structures of different thicknesses on the same semiconductor structure will now be discussed in further detail with reference to FIGS. 1-16. It is to be appreciated that FIGS. 1-8 schematically illustrate various stages of fabrication of finFET devices according to one embodiment, while FIGS. 9-16 schematically illustrate various stages of fabrication of finFET devices according to another embodiment. In the exemplary embodiments now described, both a thick gate dielectric structure and a thin gate dielectric structure will be formed at the same time, using the same (multilayer) fabrication process. It is to be appreciated that the exemplary embodiments shown in the figures illustrate a thick gate dielectric structure as having two high-k dielectric layers (bilayer) and a thin gate dielectric structure having one high-k dielectric layer. However, alternative embodiments may have different numbers of high-k layers so long as the thick gate dielectric structure has a thickness greater than the thin date dielectric structure. Many advantages flow from such fabrication process techniques. By way of example only, the capacitance-equivalent thickness in inversion ($T_{inv}$) is reduced in the finFET device with the thick gate dielectric structure. Also, for example, the fabrication process techniques are provided in order to minimize the effect of the thick gate dielectric structure fabrication process steps on the finFET device with the thin gate dielectric structure, and vice versa.

It is to be further understood that, in the exemplary embodiments, each fin structure will be part of a separate finFET device. By way of example only, in the two embodiments represented respectively by FIGS. 1-8 and FIGS. 9-16, the leftmost fin structure will be part of a thick gate dielectric finFET device, and the rightmost fin structure will be part of a thin gate dielectric finFET device. While the two fin structures, and thus the two resulting finFET devices, are shown adjacent to one another on the substrate structure, it is to be appreciated that embodiments are not so limited. That is, alternative embodiments may include any number (one or more) of thick gate dielectric finFET devices formed with any number (one or more) thin gate dielectric finFET devices on the substrate structure. Further, thick gate dielectric finFET devices may be adjacent to other thick gate dielectric finFET devices, thin gate dielectric finFET devices may be adjacent to other thin gate dielectric finFET devices, and/or thin and thick gate dielectric finFET devices may be interspersed with one another in various patterns, depending on the specific application of the integrated circuit formed by the resulting semiconductor structure.

In accordance with a first embodiment, FIG. 1 depicts a cross-sectional side view of a semiconductor structure at an initial stage of fabrication starting with a substrate structure having multiple fin structures formed thereon. More specifically, as shown, semiconductor structure 100 is formed using silicon-on-insulator (SOI) technology wherein a plurality of silicon (Si) or germanium (Ge) fin structures 102 are formed on an insulator layer (such as a buried oxide (BOX) or $SiO_2$ layer) 104, which is itself formed on a Si (or Ge) substrate 106. In an alternative embodiment, the fin structures 102 can be formed on a bulk (silicon) substrate.

Figure 2:
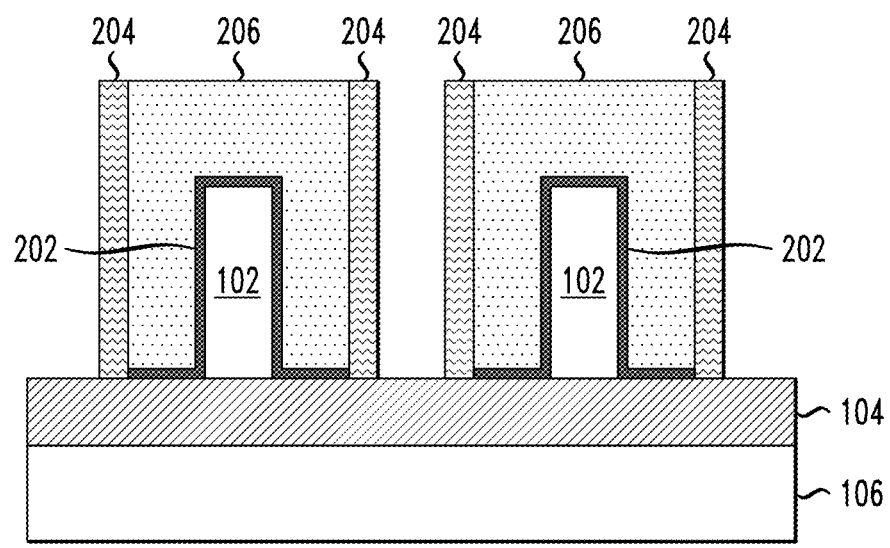
FIG. 2 is a schematic cross-sectional side view of the semiconductor structure of FIG. 1 after forming dummy gates by depositing an oxide layer over the multiple fin structures in a gate region and a gate polysilicon layer over the oxide layer between pairs of spacers, according to an embodiment of the invention.

FIG. 2 depicts a cross-sectional side view of the semiconductor structure of FIG. 1 after forming dummy gates by depositing an oxide layer over the multiple fin structures in a gate region and a gate polysilicon layer over the oxide layer between pairs of spacers. Semiconductor structure 200 shown in FIG. 2 results from these fabrication steps. More specifically, as shown, spacers 204 are formed in pairs around each of the fin structures 102. Suitable materials for forming the spacers 204 may include, but are not limited to, silicon nitride (SiN), silicoboron carbonitride (SiBCN), and/or silicon oxide carbonitride (SiOCN). The spacers 204 may be formed by depositing a spacer layer across the insulator layer 104 and the fin structures 102, and then removing select portions of the spacer layer such that only the pairs of spacers 204, as shown, and fin structures 102, remain on the insulator layer 104. Next, within the regions (which are to be gate regions) formed between the pairs of spacers 204, a dummy oxide layer 202 is formed over each of the fin structures 102 extending above the surface of the insulator layer 104 from the base of the fin structures 102 to the base of the spacers 204. Dummy gate polysilicon layer 206 is then deposited over the dummy oxide layer 202, filling the space between the pairs of spacers 204.

Figure 3:
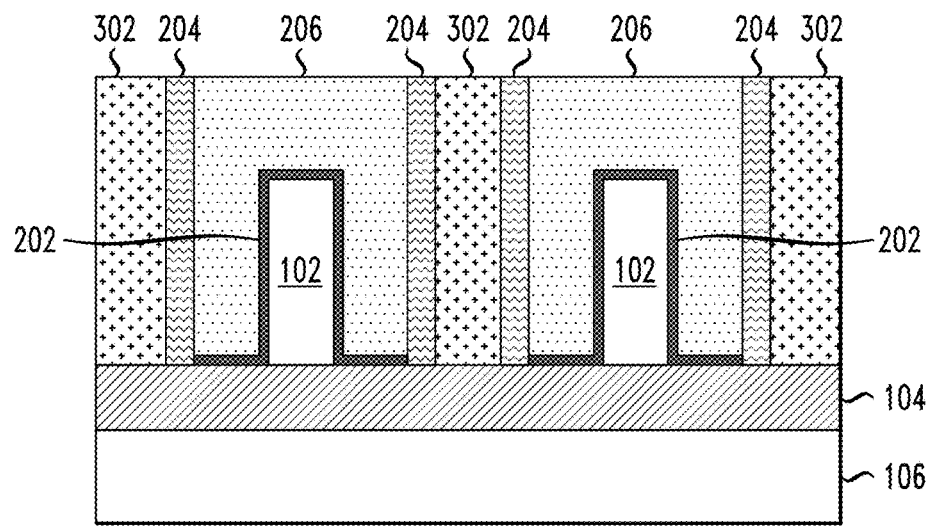
FIG. 3 is a schematic cross-sectional side view of the semiconductor structure of FIG. 2 after depositing inner layer dielectric structures and performing a chemical mechanical planarization process, according to an embodiment of the invention.

FIG. 3 depicts a cross-sectional side view of the semiconductor structure of FIG. 2 after depositing inner layer dielectric (ILD) structures and performing a chemical mechanical planarization (CMP) process. Semiconductor structure 300 shown in FIG. 3 results from these fabrication steps. More specifically, as shown, an ILD layer 302 is deposited on top of the insulator layer 104 adjacent to the spacers 204. CMP is performed on the top surface of structure 300. The ILD layer 302 is formed of a low-k dielectric material (e.g., a dielectric constant k lower than about 3.9 which is the dielectric constant k of $SiO_2$) and is used to insulate adjacent metal contacts and thus reduce undesired capacitive coupling, and hence cross-talk between metal contacts.

Figure 4:
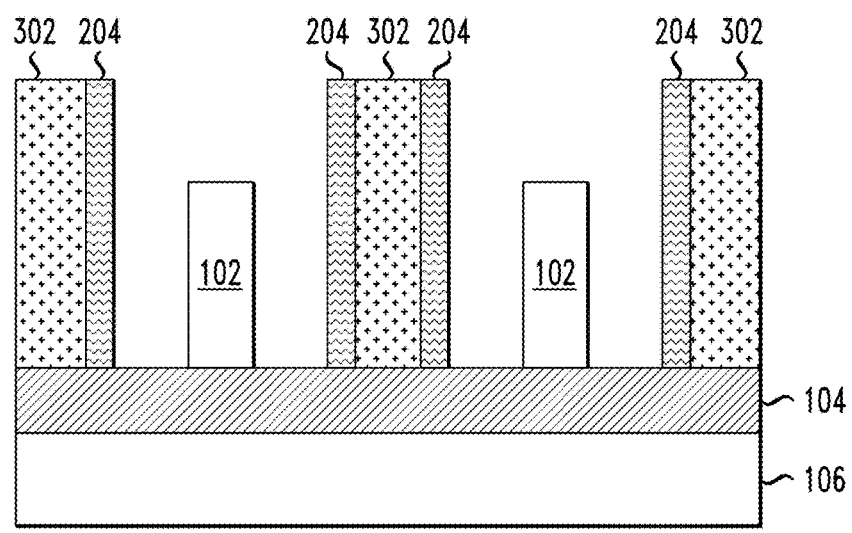
FIG. 4 is a schematic cross-sectional side view of the semiconductor structure of FIG. 3 after removing the dummy gates, according to an embodiment of the invention.

FIG. 4 is a schematic cross-sectional side view of the semiconductor structure of FIG. 3 after removing the dummy gates. Semiconductor structure 400 shown in FIG. 4 results from these fabrication steps. More specifically, as shown, the dummy gate polysilicon layer 206 and the dummy oxide layer 202 are removed from the gate regions between spacers 204, leaving fin structures 102 exposed. Layers 202 and 206 can be removed using a wet etching process.

Figure 5:
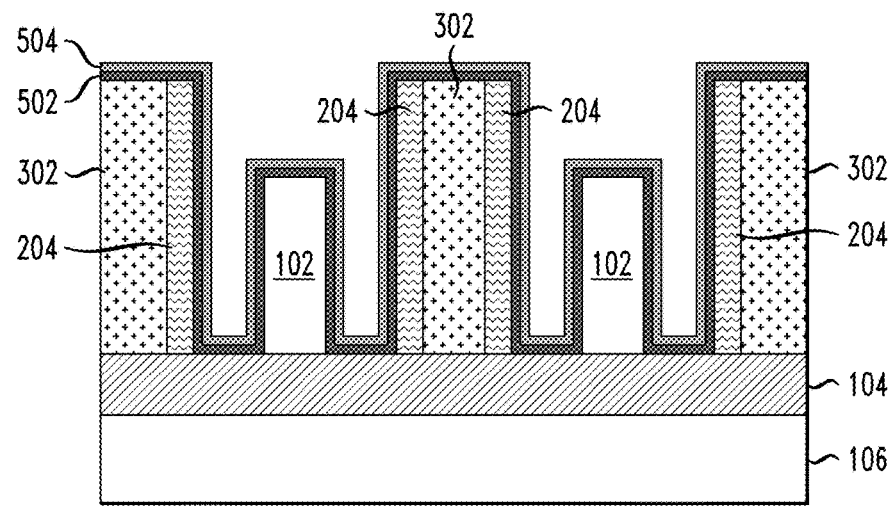
FIG. 5 is a schematic cross-sectional side view of the semiconductor structure of FIG. 4 after depositing a first high-k dielectric layer and a titanium nitride layer on the fin structures, according to an embodiment of the invention.

FIG. 5 depicts a cross-sectional side view of the semiconductor structure of FIG. 4 after depositing a first high-k dielectric layer and a titanium nitride (TiN) layer on the fin structures. Semiconductor structure 500 shown in FIG. 5 results from these fabrication steps. More specifically, as shown, a first high-k dielectric layer 502 is deposited over the top surface of the semiconductor structure 400 of FIG. 4. Suitable high-k materials for the first high-k dielectric layer 502 may include, but are not limited to, hafnium oxide ($HfO_2$), zirconium oxide ($ZrO_2$), hafnium zirconium oxide (HfZrOx), and/or lanthanum oxide (LaOx). A thin TiN layer 504 is deposited over the first high-k dielectric layer 502.

Figure 6:
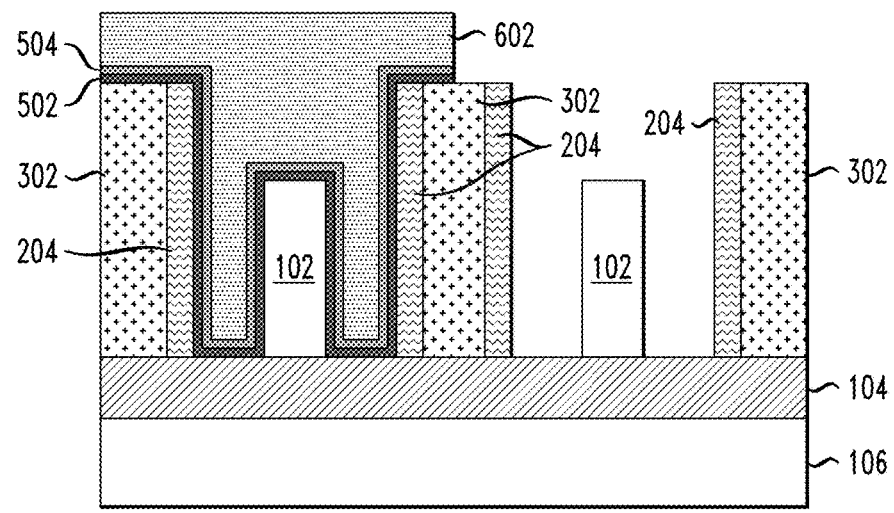
FIG. 6 is a schematic cross-sectional side view of the semiconductor structure of FIG. 5 after applying a mask to a thick gate dielectric region and removing the first high-k dielectric layer and the titanium nitride layer from a thin gate dielectric region, according to an embodiment of the invention.

FIG. 6 depicts a cross-sectional side view of the semiconductor structure of FIG. 5 after applying a mask to a thick gate dielectric region and removing the first high-k dielectric layer and the TiN layer from a thin gate dielectric region. Semiconductor structure 600 shown in FIG. 6 results from these fabrication steps. More specifically, as shown, resist mask 602 is deposited over the first finFET device (which includes the leftmost fin structure 102), protecting the first finFET device while allowing the removal of the high-k dielectric layer 502 and the TiN layer 504 from the second finFET device (which includes the rightmost fin structure 102). The high-k dielectric layer 502 can be etched using, for example, an etching process which is highly selective to the Si fin structure 102, nitride spacer 204, and insulator layer 104. Such an etching process advantageously reduces the impact of thick gate dielectric finFET device fabrication process steps on the thin gate dielectric finFET device. By way of example only, such an etch process reduces unwanted increases in gate length on one side of the channel, i.e., wherein the gate conductor is widened outside the active area causing an increase in the gate length at the active/isolation boundary on one side only of the gate.

Figure 7:
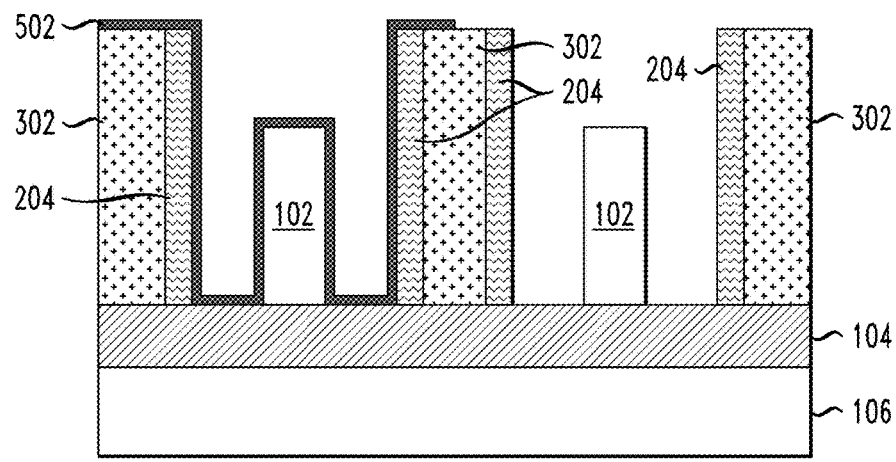
FIG. 7 is a schematic cross-sectional side view of the semiconductor structure of FIG. 6 after stripping the mask and titanium nitride layer from the thick gate dielectric region, according to an embodiment of the invention.

FIG. 7 depicts a cross-sectional side view of the semiconductor structure of FIG. 6 after stripping the mask and removing the TiN layer from a thick gate dielectric region. Semiconductor structure 700 shown in FIG. 7 results from these fabrication steps. More specifically, as shown, resist mask 602 and TiN layer 504 are removed from the thick gate dielectric finFET device (leftmost), while leaving the first high-k dielectric layer 502. Stripping/removing can be performed with a chemical solvent followed by a mechanical abrasion process, and/or with a dry etch process such as reactive ion etching.

Figure 8:
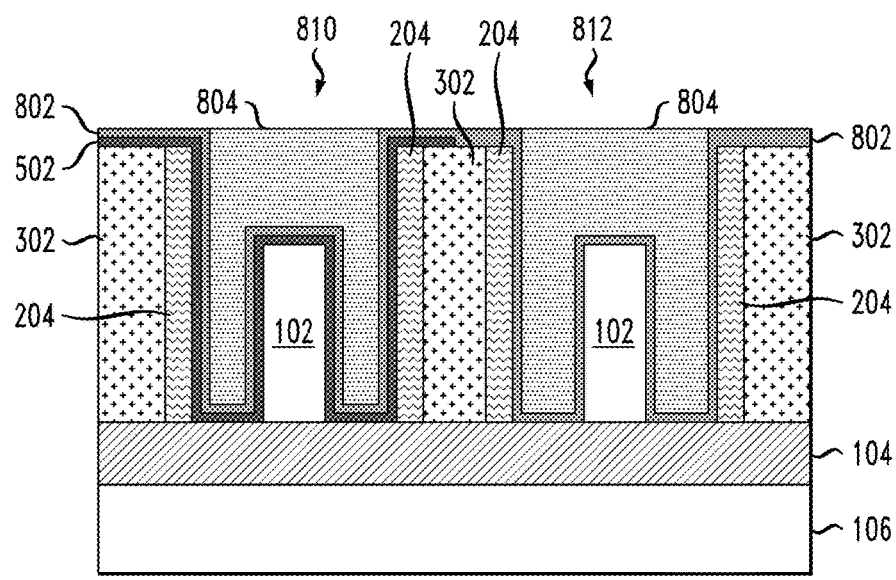
FIG. 8 is a schematic cross-sectional side view of the semiconductor structure of FIG. 7 after depositing a second high-k dielectric layer and metal gates in the thin gate dielectric region and the thick gate dielectric region, according to an embodiment of the invention.

FIG. 8 depicts a cross-sectional side view of the semiconductor structure of FIG. 7 after depositing a second high-k dielectric layer and metal gates in the thin gate dielectric region and the thick gate dielectric region. Semiconductor structure 800 shown in FIG. 8 results from these fabrication steps. More specifically, as shown, a second high-k dielectric layer 802 is deposited over the first high-k dielectric 502 in the leftmost finFET device, and over fin 102 in the rightmost finFET device. Suitable high-k materials for the second high-k dielectric layer 802 may include, but are not limited to, hafnium oxide ($HfO_2$), zirconium oxide ($ZrO_2$), hafnium zirconium oxide (HfZrOx), and/or lanthanum oxide (LaOx). It is to be appreciated that the first and second high-k dielectric layers 502 and 802 may be the same material in one embodiment, and different materials in another embodiment. Metal gates 804 are then deposited as shown for both of the finFET devices, thereby forming thick gate dielectric finFET device 810 comprising both first high-k dielectric layer 502 and second high-k dielectric layer 802, and thin gate dielectric finFET device 812 comprising only the second high-k dielectric layer 802 as shown in structure 800. A CMP process can follow the metal gate deposition in order to planarize the top surface of structure 800.

Accordingly, in thick gate dielectric regions, the multi-layer high-k material 502/high-k material 802 forms the gate dielectric structure, and in thin gate regions, the single layer high-k material 802 forms the gate dielectric structure.

While dimensions may vary from one embodiment to another, the following dimensions for certain main layers, structures and regions are provided for illustrative purposes. For those dimensions not specifically given below, it is understood that they may be selected based on standard semiconductor practices by those of ordinary skill in the art. By way of example only, the fin structures 102 may have a height of about 20-60 nm and a width of about 5-20 nm. The insulator layer 104 may have a height of about 10-200 nm. The spacers 204 may have a width of about 4-15 nm. The ILD layers 302 may have a width of about 30-100 nm. The first high-k dielectric layer 502 may have a thickness of about 1-3 nm. The second high-k dielectric layer 802 may have a thickness of about 1-5 nm. It is to be appreciated that similar layers, structures and regions in the second embodiment (FIGS. 9-16) may have the same or similar illustrative dimensions.

Referring now to FIGS. 9-16, a second embodiment will now be described. In this embodiment, a first high-k dielectric layer is deposited near the start of the fabrication process as compared to the first embodiment where the layer is deposited later in the fabrication process. Additional advantages of the second embodiment are that the fin structure for the thick gate dielectric device will experience less degradation due to the patterning process, since the fin structure is protected by the first high-k dielectric layer. Also, in the second embodiment, the first high-k dielectric layer will experience more thermal budget since it is more robust.

Figure 9:
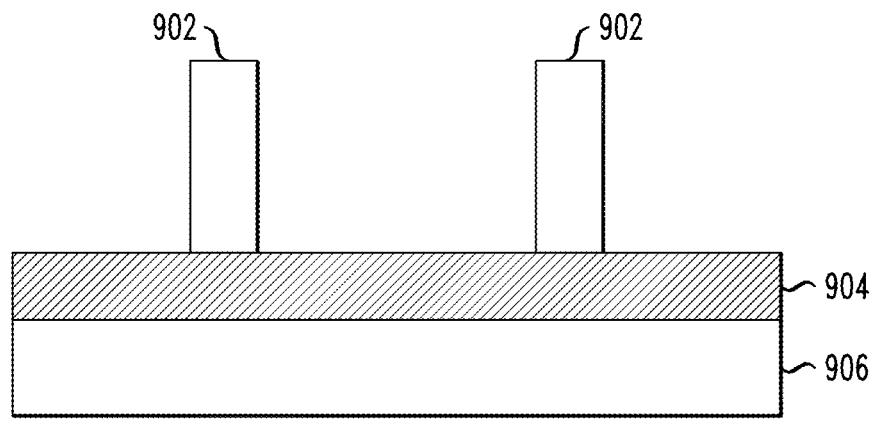
FIG. 9 is a schematic cross-sectional side view of a semiconductor structure at an initial stage of fabrication starting with a substrate structure having multiple fin structures formed thereon, according to another embodiment of the invention.

FIG. 9 depicts a cross-sectional side view of a semiconductor structure at an initial stage of fabrication starting with a substrate structure having multiple fin structures formed thereon. More specifically, as shown, semiconductor structure 900 is formed using SOI technology wherein a plurality of Si or Ge fin structures 902 are formed on an insulator layer (such as a buried oxide (BOX) or Sift layer) 904, which is formed on a Si (or Ge) substrate 906. In an alternative embodiment, the fin structures 902 can be formed on a bulk (silicon) substrate.

Figure 10:
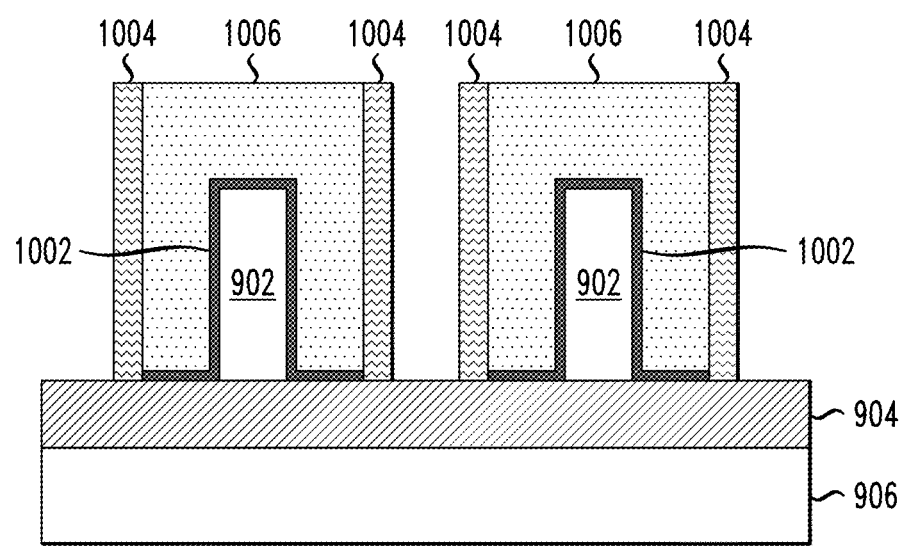
FIG. 10 is a schematic cross-sectional side view of the semiconductor structure of FIG. 9 after depositing a first high-k dielectric layer on the fin structures and forming dummy gates by depositing a gate polysilicon layer over the first high-k dielectric layer in a gate region between pairs of spacers, according to another embodiment of the invention.

FIG. 10 depicts a cross-sectional side view of the semiconductor structure of FIG. 9 after depositing a first high-k dielectric layer on the fin structures and forming dummy gates by depositing a gate polysilicon layer over the first high-k dielectric layer in a gate region between pairs of spacers. Semiconductor structure 1000 shown in FIG. 10 results from these fabrication steps. More specifically, as shown, spacers 1004 are formed in pairs around each of the fin structures 902. Suitable materials for forming the spacers 1004 may include, but are not limited to, silicon nitride (SiN), silicoboron carbonitride (SiBCN), and/or silicon oxide carbonitride (SiOCN). The spacers 1004 may be formed by depositing a spacer layer across the insulator layer 904 and the fin structures 902, and then removing select portions of the spacer layer such that only the pairs of spacers 1004, as shown, and fin structures 902, remain on the insulator layer 904. Next, within the regions (which are to be gate regions) formed between the pairs of spacers 1004, a first high-k dielectric layer 1002 is formed over each of the fin structures 902 extending above the surface of the insulator layer 904 from the base of the fin structures 902 to the base of the spacers 1004. The first high-k dielectric layer 1002 may be the same material as the first high-k dielectric layer 502 in the first embodiment. Furthermore, the second embodiment advantageously allows for the deposition of the first high-k dielectric suitable for the voltage threshold (Vt) requirements of a thick gate dielectric finFET. Dummy gate polysilicon layer 1006 is then deposited over the first high-k dielectric layer 1002, filling the space between the pairs of spacers 1004.

Figure 11:
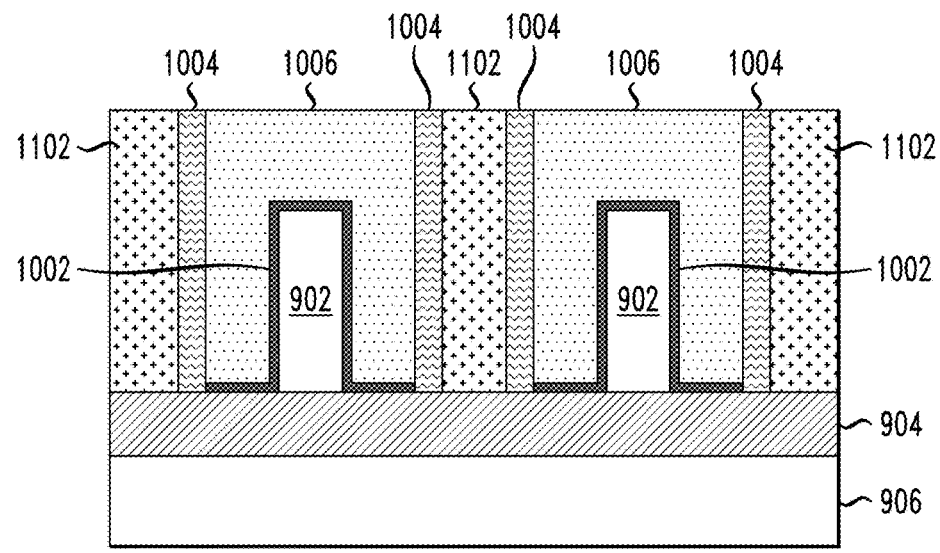
FIG. 11 is a schematic cross-sectional side view of the semiconductor structure of FIG. 10 after depositing inner layer dielectric structures and performing a chemical mechanical planarization process, according to another embodiment of the invention.

FIG. 11 depicts a cross-sectional side view of the semiconductor structure of FIG. 10 after depositing inner layer dielectric structures and performing a chemical mechanical polishing process. Semiconductor structure 1100 shown in FIG. 11 results from these fabrication steps. More specifically, as shown, an ILD layer 1102 is deposited on top of the insulator layer 904 adjacent to the spacers 1004. CMP is performed on the top surface of structure 1100.

Figure 12:
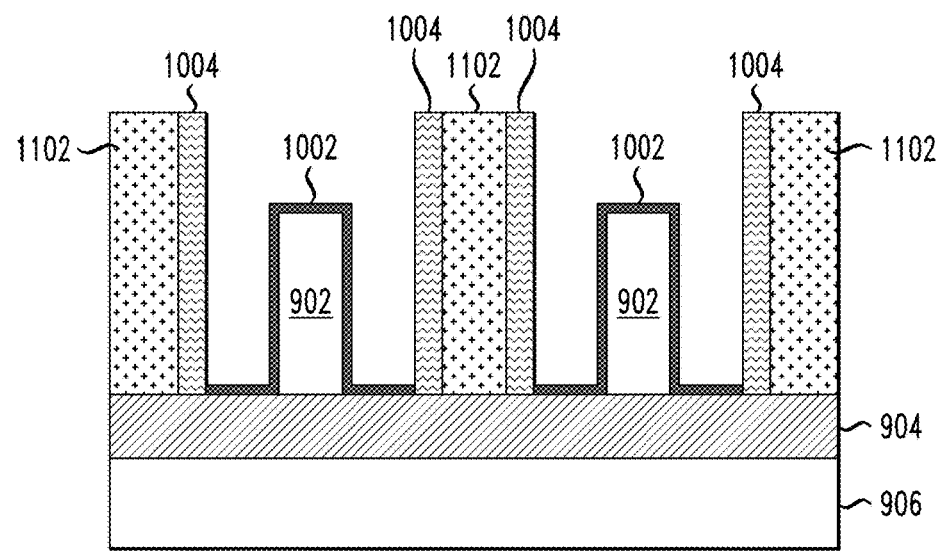
FIG. 12 is a schematic cross-sectional side view of the semiconductor structure of FIG. 11 after removing the dummy gates, according to another embodiment of the invention.

FIG. 12 depicts a cross-sectional side view of the semiconductor structure of FIG. 11 after removing the dummy gates to the first high-k dielectric layer. Semiconductor structure 1200 shown in FIG. 12 results from these fabrication steps. More specifically, as shown, the dummy gates 1006 are removed from the finFET regions between spacers 1004, leaving first high-k dielectric layers 1002 over fins 902. The dummy gate polysilicon layer 1006 may be removed using, for example, a tetramethylammonium hydroxide (TMAH) wet etch which is selective to the high-k dielectric.

Figure 13:
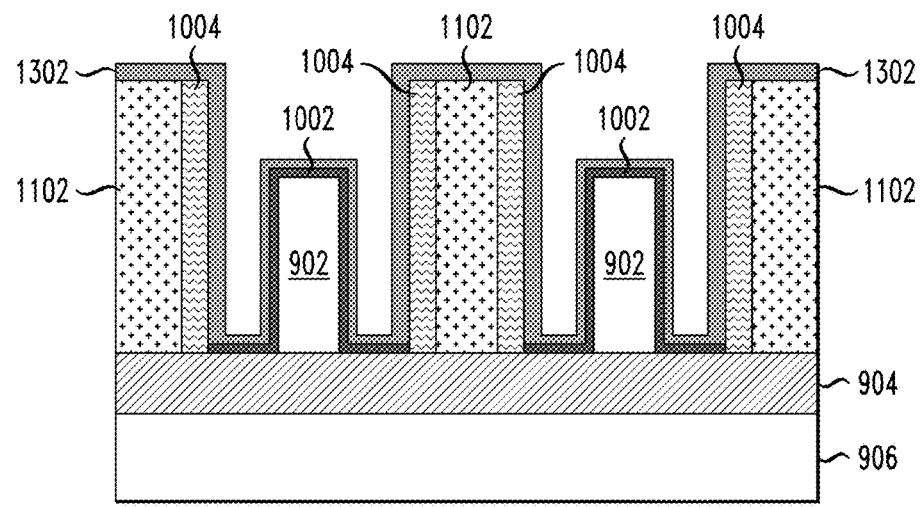
FIG. 13 is a schematic cross-sectional side view of the semiconductor structure of FIG. 12 after depositing a titanium nitride layer, according to another embodiment of the invention.

FIG. 13 depicts a cross-sectional view of the semiconductor structure of FIG. 12 after depositing a TiN layer on the first high-k dielectric layer. Semiconductor structure 1300 shown in FIG. 13 results from these fabrication steps. More specifically, as shown, a TiN layer 1302 is deposited using, for example, an atomic layer deposition (ALD) process. The TiN layer 1302 is advantageous in protecting the high-k dielectric 1002 during the high-k patterning process.

Figure 14:
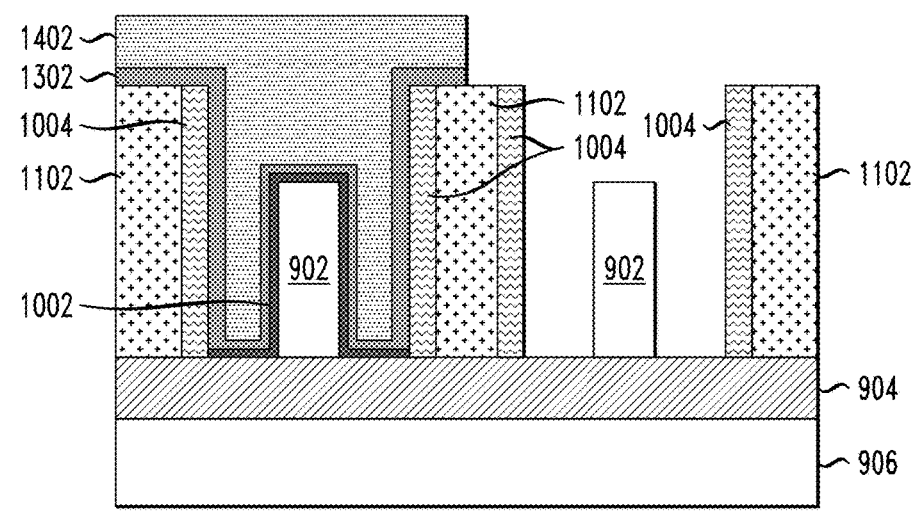
FIG. 14 is a schematic cross-sectional side view of the semiconductor structure of FIG. 13 after applying a mask to a thick gate dielectric region and removing the titanium nitride layer and the first high-k dielectric layer from a thin gate dielectric region, according to another embodiment of the invention.

FIG. 14 depicts a cross-sectional side view of the semiconductor structure of FIG. 13 after applying a mask to remove the TiN layer and the first high-k dielectric layer from a thin gate dielectric region. Semiconductor structure 1400 shown in FIG. 14 results from these fabrication steps. More specifically, as shown, resist mask 1402 is deposited over the first finFET device (which includes the leftmost fin structure 902), protecting the first finFET device while allowing the removal of the high-k dielectric layer 1002 and the TiN layer 1302 from the second finFET device (which includes the rightmost fin structure 902). The high-k dielectric layer 1002 can be etched using, for example, an etching process which is highly selective to the Si fin structure 902, nitride spacer 1004, and insulator layer 904. As mentioned above in the first embodiment, such an etching process advantageously reduces the impact of thick gate dielectric finFET device fabrication process steps on the thin gate dielectric finFET device.

Figure 15:
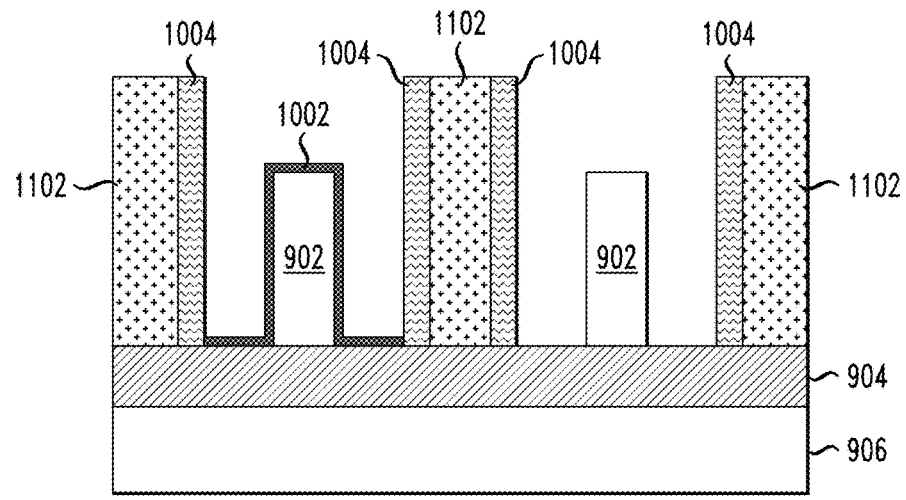
FIG. 15 is a schematic cross-sectional side view of the semiconductor structure of FIG. 14 after stripping the mask and titanium nitride layer from a thick gate dielectric region, according to another embodiment of the invention.

FIG. 15 depicts a cross-sectional view of the semiconductor structure of FIG. 14 after stripping the mask and TiN layer from a thick gate dielectric region. Semiconductor structure 1500 shown in FIG. 15 results from these fabrication steps. More specifically, as shown, resist mask 1402 is removed followed by the stripping of the TiN layer 1302 from the thick gate dielectric finFET device (leftmost), while leaving the first high-k dielectric layer 1002. The stripping process is an etching process which is selective to the high-k dielectric 1002.

Figure 16:
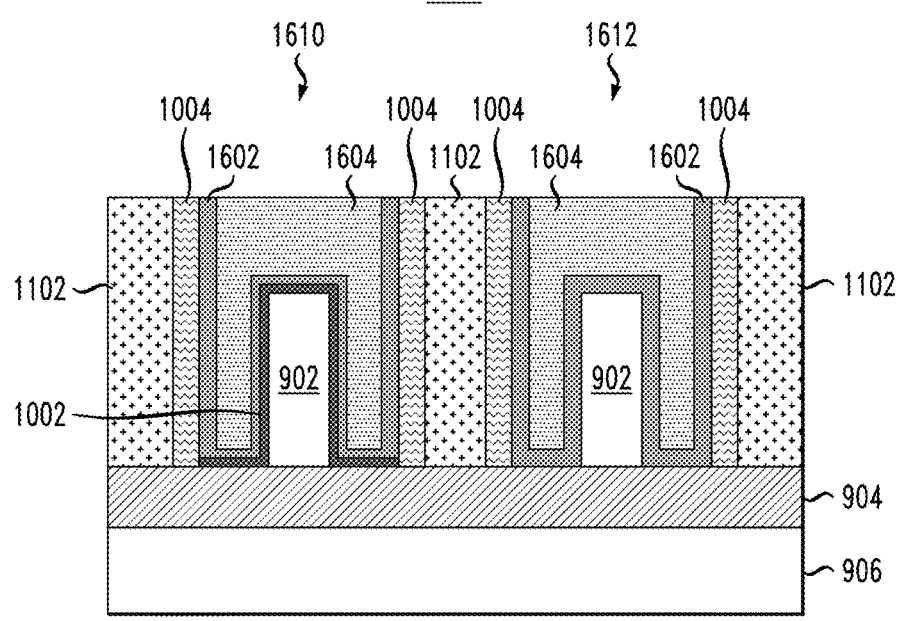
FIG. 16 is a schematic cross-sectional side view of the semiconductor structure of FIG. 15 after depositing a second high-k dielectric layer and metal gates in the thin gate dielectric region and the thick gate dielectric region, according to an embodiment of the invention.

FIG. 16 depicts a cross-sectional side view of the semiconductor structure of FIG. 15 after depositing a second high-k dielectric layer and metal gates in the thin gate dielectric region and the thick gate dielectric region. Semiconductor structure 1600 shown in FIG. 16 results from these fabrication steps. More specifically, as shown, a second high-k dielectric layer 1602 is deposited over the first high-k dielectric 1002 in the leftmost finFET device, and over fin 902 in the rightmost finFET device. Suitable high-k materials for the second high-k dielectric layer 1602 may be similar to that of high-k layer 802 in the first embodiment. It is to be appreciated that the first and second high-k dielectric layers 1002 and 1602 may be the same material in one embodiment, and different materials in another embodiment. Metal gates 1604 are then deposited as shown for both of the finFET devices, thereby forming thick gate dielectric finFET device 1610 comprising both first high-k dielectric layer 1002 and second high-k dielectric layer 1602, and thin gate dielectric finFET device 1612 comprising only the second high-k dielectric layer 1602 as shown in structure 1600. A CMP process can follow the metal gate deposition in order to planarize the top surface of structure 1600.

Accordingly, in thick gate dielectric regions, the multilayer high-k material 1002/high-k material 1602 forms the gate dielectric structure, and in thin gate regions, the single layer high-k material 1602 forms the gate dielectric structure.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method, comprising steps of:
   forming a first finFET device on a substrate structure wherein the first finFET device comprises a first gate dielectric structure having a first thickness; and
   forming a second finFET device on the substrate structure wherein the second finFET device comprises a second gate dielectric structure having a second thickness;
   wherein the first thickness and the second thickness are different, and the first finFET device forming step and the second finFET device forming step are part of the same fabrication process; and
   wherein forming the first and second finFET devices further comprises:
      forming respective fin structures on the substrate structure;
      forming respective pairs of spacers proximate to the respective fin structures;
      depositing dummy oxide layers on the respective fin structures;
      depositing dummy gate polysilicon layers over the dummy oxide layers; and
      depositing inner-layer dielectric layers adjacent to the respective pairs of spacers.

2. The method of claim 1, wherein the substrate structure is an insulated substrate structure comprising an insulator layer deposited on a silicon substrate.

3. The method of claim 2, wherein the insulator layer is a buried oxide material.

4. The method of claim 1, wherein the first thickness is greater than the second thickness.

5. The method of claim 1, wherein the first gate dielectric structure is a thick gate dielectric structure, and the second gate dielectric structure is a thin gate dielectric structure.

6. The method of claim 5, wherein the thick gate dielectric structure comprises a first dielectric layer and a second dielectric layer.

7. The method of claim 6, wherein the thin gate dielectric structure comprises the second dielectric layer.

8. The method of claim 6, wherein the first dielectric layer and the second dielectric layer are high-k dielectric layers.

9. The method of claim 1, wherein forming the first and second finFET devices further comprises:
   removing the dummy oxide layers and the dummy gate polysilicon layers from the respective fin structures;
   depositing a first dielectric layer on the respective fin structures; and
   depositing a titanium nitride layer over the first dielectric layer.

10. The method of claim 9, wherein forming the first and second finFET devices further comprises:
    forming a resist mask over the first finFET device to protect the titanium nitride layer and the first dielectric layer on the first finFET device; and
    removing the titanium nitride layer and the first dielectric layer from the second finFET device.

11. The method of claim 10, wherein forming the first and second finFET devices further comprises removing the resist mask and the titanium nitride layer from the first finFET device.

12. The method of claim 11, wherein forming the first and second finFET devices further comprises:
    depositing a second dielectric layer over the first and second finFET devices; and
    forming respective metal gates for the first and second finFET devices.

13. A method comprising:
    forming a first finFET device on a substrate structure wherein the first finFET device comprises a first gate dielectric structure having a first thickness; and
    forming a second finFET device on the substrate structure wherein the second finFET device comprises a second gate dielectric structure having a second thickness;
    wherein the first thickness and the second thickness are different, and the first finFET device forming step and the second finFET device forming step are part of the same fabrication process; and
    wherein forming the first and second finFET devices further comprises:
       forming respective fin structures on the substrate structure;
       forming respective pairs of spacers proximate to the respective fin structures;
       depositing first dielectric layers on the respective fin structures;
       depositing dummy gate polysilicon layers over the respective first dielectric layers;
       depositing inner-layer dielectric layers adjacent to the respective pairs of spacers;
       removing the dummy gate polysilicon layers; and
       depositing a titanium nitride layer over the respective first dielectric layers.

14. The method of claim 13, wherein forming the first and second finFET devices further comprises:
    forming a resist mask over the first finFET device to protect the titanium nitride layer and the first dielectric layer on the first finFET device;
    removing the titanium nitride layer and the first dielectric layer from the second finFET device;
    removing the resist mask and the titanium nitride layer from the first finFET device;
    depositing a second dielectric layer over the first and second finFET devices; and
    forming respective metal gates for the first and second finFET devices.

15. The method of claim 13, wherein the substrate structure is an insulated substrate structure comprising an insulator layer deposited on a silicon substrate.

16. The method of claim 15, wherein the insulator layer is a buried oxide material.

17. The method of claim 13, wherein the first gate dielectric structure is a thick gate dielectric structure, and the second gate dielectric structure is a thin gate dielectric structure.

18. The method of claim 17, wherein the thick gate dielectric structure comprises a first dielectric layer and a second dielectric layer.

19. The method of claim 18, wherein the thin gate dielectric structure comprises the second dielectric layer.

20. The method of claim 18, wherein the first dielectric layer and the second dielectric layer are high-k dielectric layers.

* * * * *